(12) United States Patent
Teig et al.

(10) Patent No.: US 6,976,237 B1
(45) Date of Patent: *Dec. 13, 2005

(54) METHOD AND APPARATUS FOR ESTIMATING DISTANCES IN A REGION

(75) Inventors: Steven Teig, Menlo Park, CA (US); Jonathan Frankle, Los Gatos, CA (US)

(73) Assignee: Cadence Design Systems, Inc., San Jose, CA (US)

(*) Notice: Subject to any disclaimer, the term of this patent is extended or adjusted under 35 U.S.C. 154(b) by 57 days.

This patent is subject to a terminal disclaimer.

(21) Appl. No.: 10/174,661

(22) Filed: Jun. 19, 2002

(51) Int. Cl.⁷ .......................................... G06F 17/50
(52) U.S. Cl. .......................... 716/13; 716/9; 716/11; 716/14
(58) Field of Search ................... 382/151; 716/1, 716/14, 19, 4, 9, 11, 13; 702/158

(56) References Cited

U.S. PATENT DOCUMENTS

| | | | |
|---|---|---|---|
| 5,371,690 A | * | 12/1994 | Engel et al. ............... 382/151 |
| 5,618,744 A | * | 4/1997 | Suzuki et al. ............... 716/1 |
| 5,757,656 A | | 5/1998 | Hershberger et al. |
| 6,167,555 A | | 12/2000 | Lakos |
| 6,324,675 B1 | | 11/2001 | Dutta et al. |
| 6,341,366 B1 | | 1/2002 | Wang et al. |
| 6,539,521 B1 | * | 3/2003 | Pierrat et al. ............... 716/4 |
| 2003/0121017 A1 | | 6/2003 | Andreev et al. |

OTHER PUBLICATIONS

U.S. Appl. No. 10/174,662, filed Jun. 19, 2002, Teig et al.
U.S. Appl. No. 10/175,390, filed Jun. 19, 2002, Teig et al.

* cited by examiner

*Primary Examiner*—Thuan Do
(74) *Attorney, Agent, or Firm*—Stattler Johansen & Adeli LLP

(57) ABSTRACT

Some embodiments of the invention provide a method that computes an estimated distance between an external point and a set of points in the region. This method identifies a characteristic of the set of points. Based on the identified characteristic, the method then identifies a polygon that encloses the set of points. It then identifies a distance between the point and the polygon. Finally, it uses the identified distance to identify the estimated distance.

26 Claims, 8 Drawing Sheets

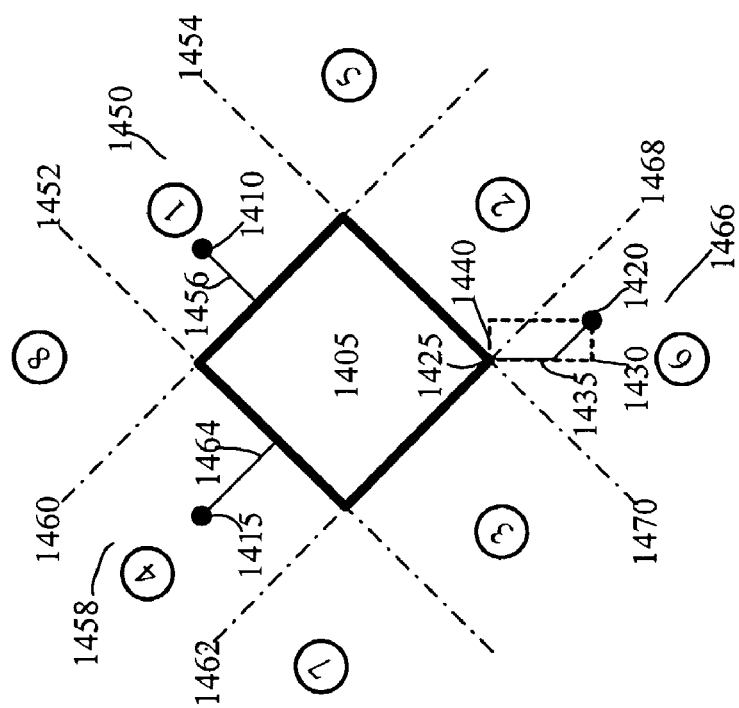
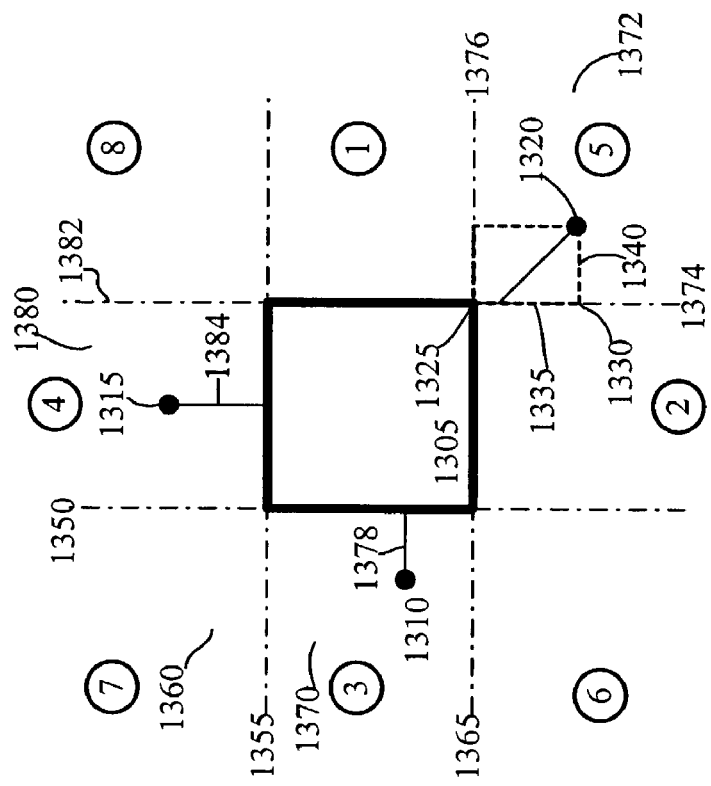
Figure 14
Figure 13

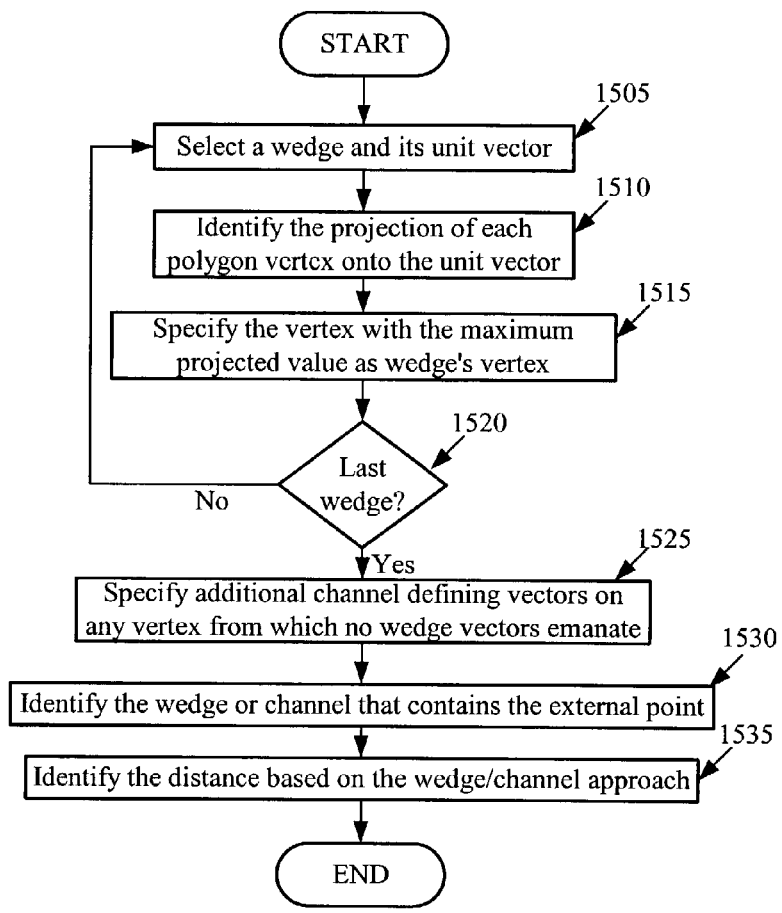
*Figure 15*
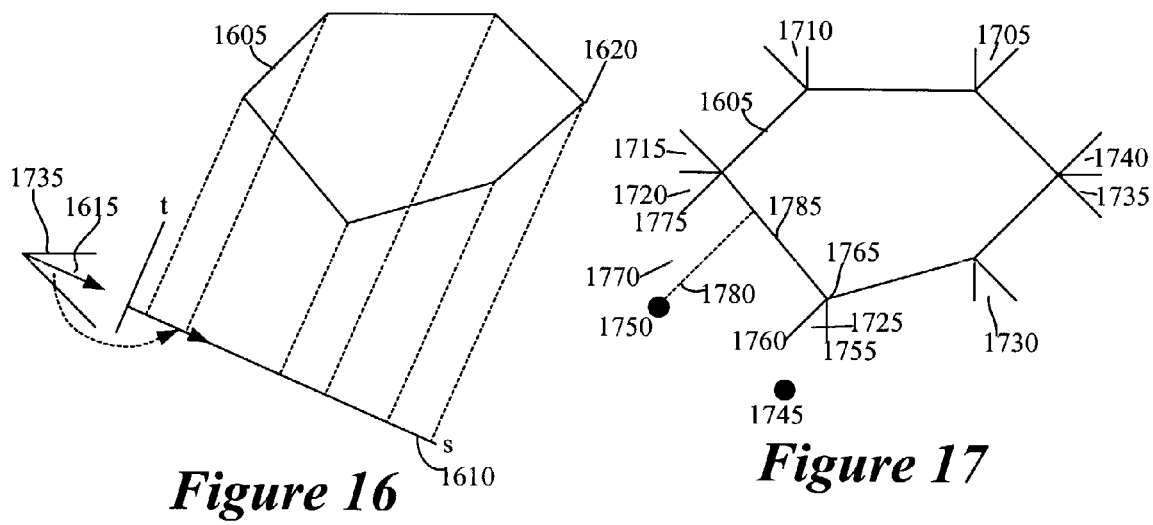
*Figure 16*
*Figure 17*

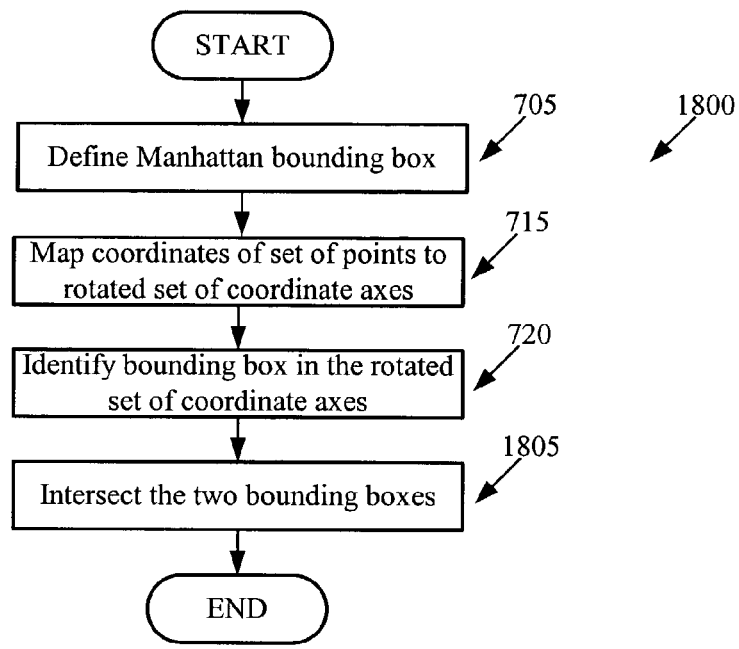
*Figure 18*
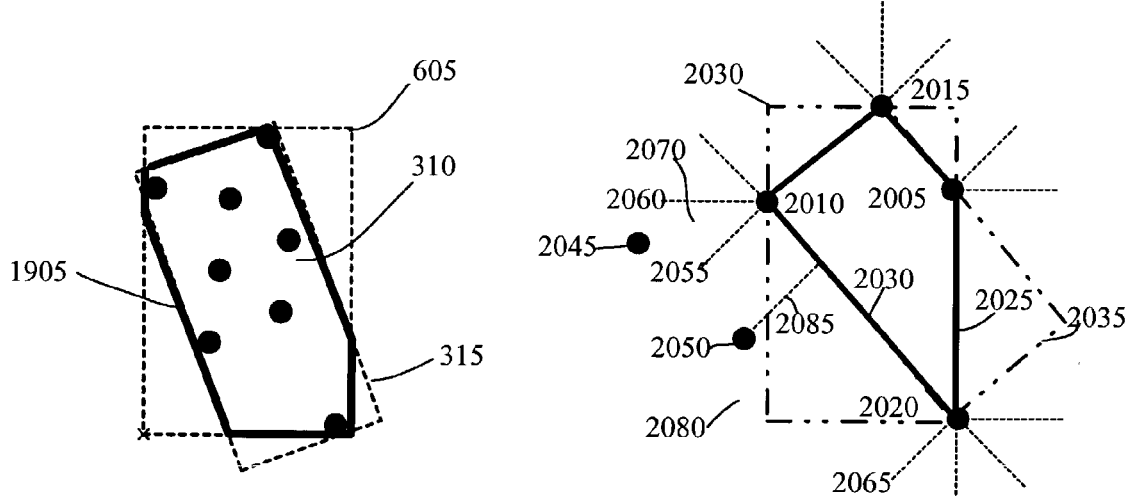
*Figure 19*
*Figure 20*

METHOD AND APPARATUS FOR ESTIMATING DISTANCES IN A REGION

FIELD OF THE INVENTION

The invention is directed towards method and apparatus for estimating distances in a region.

BACKGROUND OF THE INVENTION

An integrated circuit ("IC") is a device (e.g., a semiconductor device) that includes many electronic components, such as transistors, resistors, diodes, etc. These components are often interconnected to form multiple circuit components, such as gates, cells, memory units, arithmetic units, controllers, decoders, etc. An IC includes multiple layers of wiring that interconnect its electronic and circuit components. Traditionally, IC's use preferred direction ("PD") wiring models, which specify a preferred wiring direction for each of their wiring layers. In preferred direction wiring models, the preferred direction typically alternates between successive wiring layers. One example of a PD wiring model is the PD Manhattan wiring model, which specifies alternating layers of preferred-direction horizontal and vertical wiring.

Wiring models have been proposed that allow wiring in diagonal directions (e.g., one wiring model allows wiring in horizontal, vertical, and ±45° diagonal directions). Some of these wiring models are non-preferred direction ("NPD") wiring models. An NPD wiring model has at least one NPD wiring layer, on which two or more wiring directions are equally preferable and are at least as preferable as all other wiring directions on that layer.

Design engineers design IC's by transforming logical or circuit descriptions of the IC's into geometric descriptions, called layouts. IC layouts typically include (1) circuit modules (i.e., geometric representations of electronic or circuit IC components) with pins, and (2) interconnect lines (i.e., geometric representations of wiring) that connect the pins of the circuit modules. A net is typically defined as a collection of pins that need to be connected. A list of all or some of the nets in a layout is referred to as a net list.

To create layouts, design engineers typically use electronic design automation ("EDA") applications. These applications provide sets of computer-based tools for creating, editing, and analyzing IC design layouts. One EDA tool is a router that defines routes for interconnect lines that connect the pins of nets.

In many EDA applications and other computer-aided design ("CAD") applications, it is often necessary to obtain quickly a lower bound estimate of the distance between points in a layout. For instance, EDA routers often need to identify the actual distances or lower-bound distance estimates between routed and unrouted points in the layout. Some routers enumerate distances between routed and unrouted points to select successive points to route. Other routers have employed a variety of techniques to obtain lower-bound estimates. For example, some routers use a bounding-box technique to identify such estimates.

FIG. 1 presents one example that illustrates a bounding-box technique. This figure illustrates a point 105 and a set of points 110. All the points are part of a design layout 115. In this example, the set of points 110 includes points that have been routed, while the point 105 is a point that has not yet been routed. FIG. 1 also illustrates a rectangular bounding box 120 that encloses the set of points 110. The sides of this bounding box are parallel to the x- and y-coordinate axes of the layout's coordinate system 125. As shown in this figure, one lower-bound distance estimate between the point 105 and the set of points 110 is the Manhattan distance 130 between the point 105 and the bounding box 120. This lower-bound estimate is not a good estimate of the minimum distance from the point 105 to the set of points. The wide distribution of the set of points with respect to the x- and y-axes results in a large bounding box 120 that is not representative of the set of points. Also, the bounding box's position with respect to the external point 105 results in a poor estimated distance. Therefore, there is a need in the art for a method that generates better estimates of distance in design layouts. Also, there is a need to identify quickly the bounding polygon for a set of points.

SUMMARY OF THE INVENTION

Some embodiments of the invention provide a method that computes an estimated distance between an external point and a set of points in the region. This method identifies a characteristic of the set of points. Based on the identified characteristic, the method then identifies a polygon that encloses the set of points. It then identifies a distance between the point and the polygon. Finally, it uses the identified distance to identify the estimated distance.

BRIEF DESCRIPTION OF THE DRAWINGS

The novel features of the invention are set forth in the appended claims. However, for purpose of explanation, several embodiments of the invention are set forth in the following figures.

FIG. 13 illustrates how to compute the octilinear distance between an external point and a Manhattan bounding box.

FIG. 14 illustrates how to compute the octilinear distance between an external point and a 45° rotated bounding box.

FIG. 15 illustrates a process that computes the octilinear distance between an external point and a non-45' rotated bounding box or a more general bounding polygon.

FIG. 16 illustrates how to identify the vertex of a bounding polygon for a wedge.

FIG. 17 illustrates the location of eight wedges about a bounding polygon.

FIG. 18 illustrates a process that constructs such an octilinear bounding polygon.

FIG. 19 illustrates an example of a bounding polygon of a set of points that was constructed quickly by intersecting the Manhattan and rotated bounding boxes of the set of points.

FIG. 20 illustrates an example of an octilinear bounding polygon that is identified by intersecting an axis-aligned box and a 45° rotated box.

DETAILED DESCRIPTION OF THE INVENTION

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

Several processes are described below for computing estimated distances between a set of points and an external point outside of the set. In the embodiments described below, the points are within a region of a design layout. In other embodiments, however, the points can be in a region of any two or higher dimensional space. For instance, some embodiments can be employed for mapping, network routing, or any other application that uses computational geometry. In the design layout context, some embodiments can be employed in a variety of EDA or CAD tools, such as routers or placers.

I. Non-Manhattan Bounding Polygon and Multi-Bounding Polygons

Figure 1:
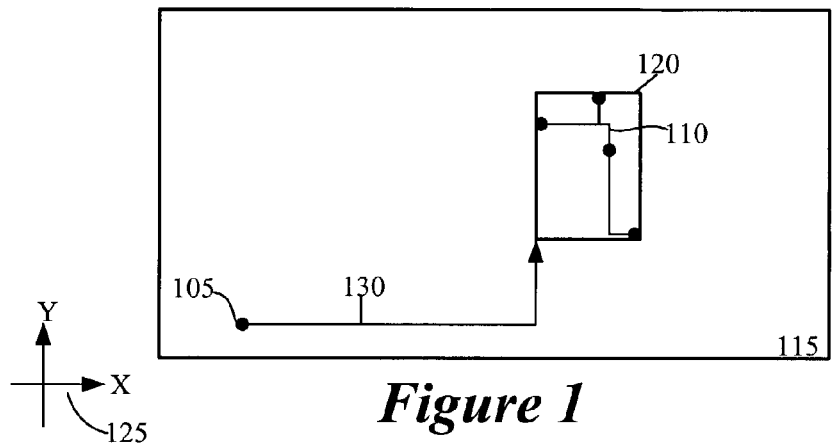
FIG. 1 illustrates a prior art technique for estimating the distance between a point and a set of points.
Figure 2:
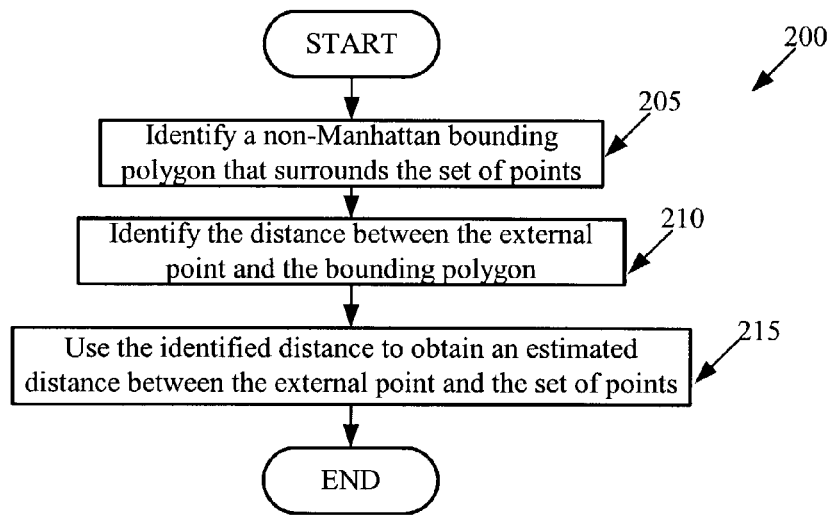
FIG. 2 illustrates a process that computes an estimated distance between a set of points and an external point outside of the set in a design layout.
Figure 3:
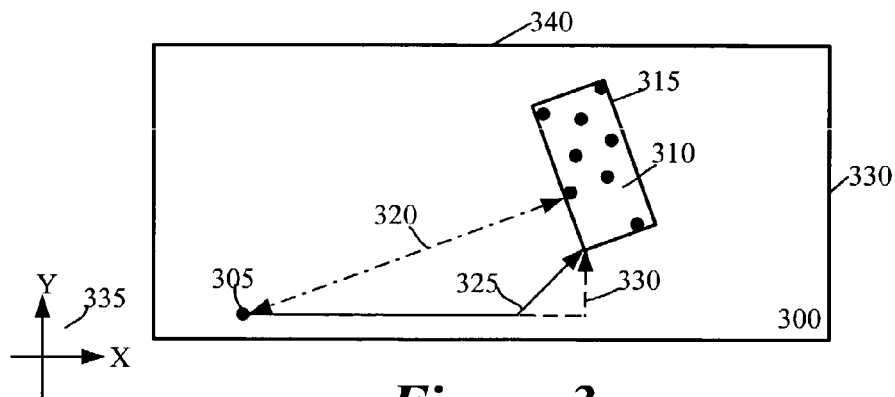
FIG. 3 illustrates a design layout that includes a set of eight points and an external point.

FIG. 2 illustrates a process 200 that computes an estimated distance between a set of points and an external point outside of the set in a design layout. The set of points can include a few points or a large number of points. In some cases, the set of points can include an infinite number of points when the set includes one or more polygonal shapes that have two or more dimensions. FIG. 3 illustrates a simple example of a set of points and an external point. Specifically, it illustrates a design layout 300 that includes a set of eight points 310 and an external point 305.

As shown in FIG. 2, the process 200 initially identifies (at 205) a non-Manhattan polygon that encloses the set of points. A non-Manhattan polygon is a polygon that has several sides, where one or more of its sides are at an angle other than 0° or 90° with respect to the design layout's sides. In the embodiments described below, the non-Manhattan polygon is a convex polygon. Other embodiments, however, might use non-convex polygons, as further described below.

In the example illustrated in FIG. 3, the non-Manhattan polygon is a rotated bounding rectangle 315 that surrounds the set of points 310. Each of the four sides of the bounding box 315 is at an angle other than 0° or 90° with respect to the x- and y-axes 335 of the layout 300. In other words, none of the sides of the bounding box 315 is parallel to either axis of the layout's coordinate system. In this example, the x- and y-axes 335 of the layout 300 are aligned with the layout's sides 330 and 340.

Figure 4:
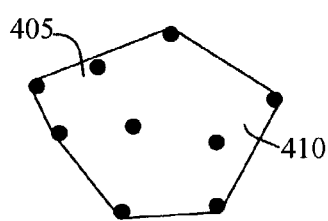
FIG. 4 illustrates the convex hull for a set of points.

The non-Manhattan polygon identified at 205 need not be a rotated bounding rectangle, as in FIG. 3. For instance, this polygon is a convex hull in some embodiments, and an approximate convex hull in other embodiments. A convex hull of a set of points is the smallest convex polygon that encloses each point in the set (i.e., each point in the set is either on the boundary or in the interior of the polygon). A convex hull is convex with respect to a particular metric. A polygon is convex with respect to a metric if any pair of points in the interior can be connected with a geodesic (i.e., shortest path) in that metric without crossing the boundary of the polygon. FIG. 4 illustrates the convex hull 405 for a set of points 410. There are several well-known techniques for constructing a convex hull of a set of points. These techniques include Graham's Scan and Jarvis March (i.e., Gift Wrap).

Figure 5:
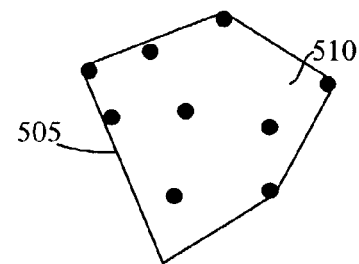
FIG. 5 illustrates an approximate convex hull for a set of points.

An approximate convex hull of a set of points is any convex polygon that contains the set of points, and that approximates the convex hull for the set of points. It might be larger than a convex hull but it can be constructed faster than a convex hull. FIG. 5 illustrates an approximate convex hull 505 for a set of points 510. There are several well-known techniques for constructing an approximate convex hull. One such technique is the BFP (Bentley-Faust-Preparata) technique. See also Jon Bentley, G. M. Faust & Franco Preparata, "Approximation Algorithms for Convex Hulls", Comm. ACM 25, 64–68 (1982).

After identifying the non-Manhattan bounding polygon at 205, the process 200 identifies (at 210) the shortest distance between the external point and the bounding polygon. The shortest distance is dependent on the interconnect-line model used by the CAD application that uses the process 200. This is illustrated in FIG. 3. Specifically, as illustrated in this figure, the shortest distance (1) is specified by line 320 when the application uses a Euclidean model (i.e., a model that allows interconnect lines in any direction), (2) is specified by horizontal and perpendicular line segments 330 when the application uses a Manhattan model (i.e., a model that only allows interconnect lines in horizontal and vertical directions), and (3) is specified by horizontal and 45° diagonal lines segments 325 when the application uses an octilinear model that allows interconnect lines in horizontal, vertical, and ±45° directions. Section III describes how these distances can be computed.

To simplify the discussion, the remaining examples are provided for a CAD application that uses an octilinear interconnect model that allows wiring in horizontal, vertical, and +45° directions. Accordingly, in these examples, the shortest distance between an external point and a bounding polygon is the length of the shortest path between them that uses only horizontal, vertical, and/or ±45° lines. In the discussion below, this distance will be referred to as the octilinear distance.

After 210, the process 200 uses (at 215) the identified distance in determining an estimated distance between the external point and the set of points. In some embodiments, the process defines the estimated distance as the distance identified at 210. For instance, in the example illustrated in FIG. 3, some embodiments define the distance 325 as the estimated distance between the point 305 and the set of points 310.

In other embodiments, the process derives (at 215) the estimated distance from the identified distance. For instance, in addition to the first non-Manhattan bounding polygon, some embodiments (1) identify a second bounding polygon that encloses the set of points, (2) identify the distance between the external point and the second polygon, and then (3) identify (at 215) the estimated distance based on the distances to the first and second polygons. Some embodiments described below define the estimated distance as the maximum of the distances to the first and second polygons. Some embodiments so define the estimated distance because they use this distance as a lower bound on the distance between the external point and the set of points. Other embodiments, however, might define the estimated distance differently. For instance, some embodiments might define estimated distance as the minimum of the distances to the first and second polygons. Yet other embodiments might compute the estimated distance from the distances to the first and second polygons (e.g., specify the estimated distance as the average the two distances).

Figure 6:
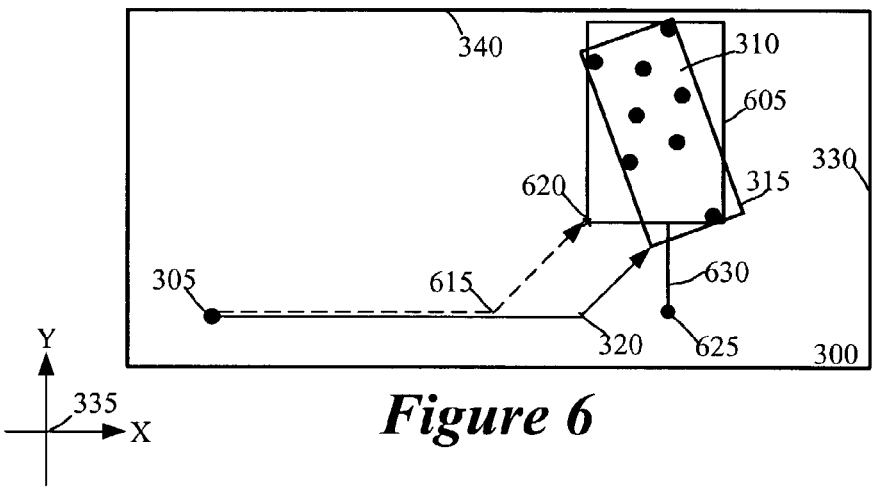
FIG. 6 illustrates an example of a two-polygon approach.

FIG. 6 illustrates an example of a two-polygon approach. Specifically, this example is similar to the example illustrated in FIG. 3, except that two bounding polygons are defined for the set of points 310. The first bounding polygon is the above-discussed rotated bounding box 315. The second bounding polygon is a Manhattan bounding box 605 that surrounds the set of points 310. Bounding rectangle 605 is a Manhattan box as each of its four sides is aligned with the x- or y-coordinate axis 335 of the layout 300 (i.e., is at a 0° or 90° angle with respect to the layout's x- or y-axis 335).

The octilinear distance between the external point 305 and the box 605 is the distance between the external point 305 and the box's vertex 620. This distance is smaller than the octilinear distance 320 between the external point 305 and the first bounding box 315. Accordingly, some embodiments identify the estimated distance between the external point 305 and the set of points 310 as the distance 320 to the rotated bounding box 315. On the other hand, for the external point 625, the distance 630 to the Manhattan bounding box would be larger, and thereby provide a better lower bound estimate.

Figure 7:
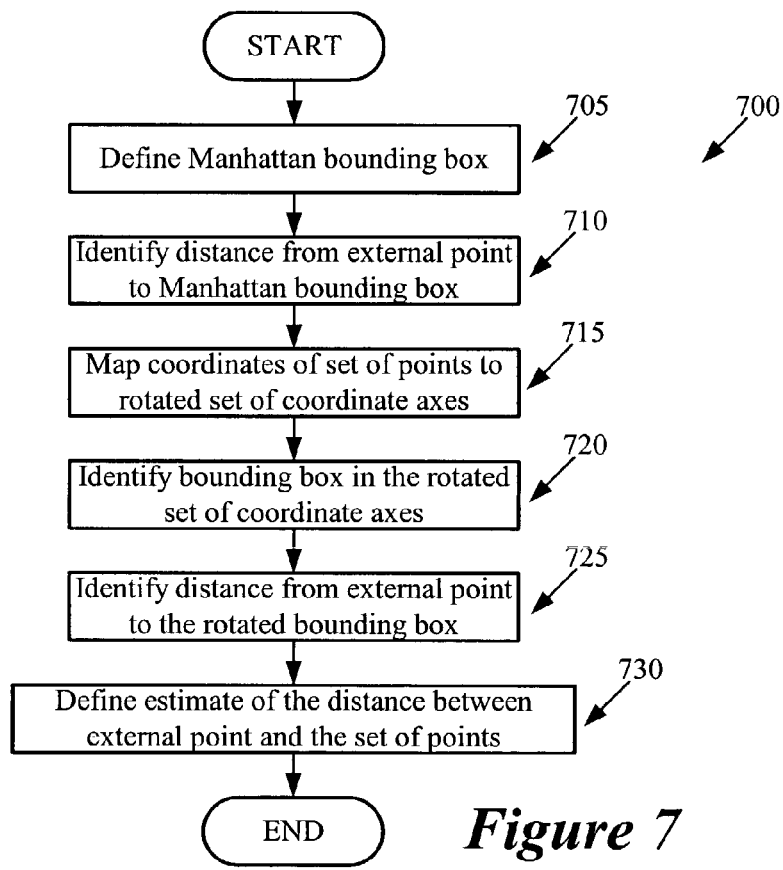
FIG. 7 illustrates a process that uses the above-described two-polygon approach to obtain an estimated distance between a set of points and an external point outside of the set in a design layout.

FIG. 7 illustrates a process 700 that uses the above-described two-polygon approach to obtain an estimated distance between a set of points and an external point outside of the set in a design layout. The process 700 will be described below by reference to the example illustrated in FIG. 8. This figure illustrates an IC layout 800 that includes a set of routed points 805 and an unrouted element 810. In this example, the set 805 includes four routable elements (e.g., pins) of a net and a set of routing paths between the routable elements. The layout 800 has a Cartesian coordinate system 815. This layout uses an octilinear wiring model that allows wiring in horizontal, vertical, and ±45° directions. Even though the process 700 is described by reference to this example, one of ordinary skill will realize that in other embodiments the set of routing points might include only the routable elements of a net. Also, an EDA router could use process 700 to identify the distance between a set of unrouted elements and a routed element. Alternatively, other EDA or CAD tools could use this process to identify other distances in a layout.

As shown in FIG. 7, the process 700 initially defines (at 705) a Manhattan bounding box that encloses the set of points. In the example illustrated in FIG. 8, the Manhattan bounding box is box 820 that encloses the routed set 805 and that has sides parallel with the layout's coordinate axes 815.

At 705, the process uses one of the known techniques in the art for defining the four-sided Manhattan bounding box. For instance, in some embodiments, the process (1) identifies the minimum and maximum x- and y-coordinates ($X_{MIN}$, $X_{MAX}$, $Y_{MIN}$, and $Y_{MAX}$) of the set of points in the design layout's coordinate space, and (2) specifies the four vertices of the box as ($X_{MIN}$, $Y_{MIN}$), ($X_{MIN}$, $Y_{MAX}$), ($X_{MAX}$, $Y_{MIN}$), and ($X_{MAX}$, $Y_{MAX}$). In some embodiments, the process 700 identifies the minimum and maximum x- and y-coordinates of the set of points by examining the x- and y-coordinates of vertex points in the set. Each standalone point in the set is a vertex point. As mentioned above, the set of points can include a large or infinite number of points, as it can include one or more multi-dimensional convex polygonal shapes. Accordingly, each point in the set that is a vertex of a convex polygonal shape in the set is a vertex point of the set. In the example illustrated in FIG. 8, the points that are examined are the four routable elements of the set of points 805 and the bend points of the paths that connect these four routable elements. These four routable elements are the vertices of the three path segments between these elements.

After defining the Manhattan bounding box, the process identifies (at 710) the octilinear distance between the external point and the Manhattan bounding box. Section III below describes how some embodiments compute such a distance. In the example illustrated in FIG. 8, the octilinear distance between the unrouted point 810 and the box 820 is the distance between this point and the box's vertex 825. The distance is traversed by the horizontal and diagonal line segments 850.

After 710, the process 700 identifies a second bounding box that encloses the set of points. The second bounding box is defined with respect to a coordinate system that is rotated with respect to the layout's coordinate system. In the example illustrated in FIG. 8, the rotated coordinate system is a Cartesian coordinate system 830 that is rotated by 45° with respect to the layout's coordinate system 815. The rotated coordinate system 830 includes an s-axis that is at 45° with respect to the x-axis of the layout's coordinate space 815, and a t-axis that is at 135° with respect to the x-axis of the layout's coordinate space 815.

The process 700 performs 715 and 720 to identify the second bounding box. At 715, the process maps the coordinates of the vertex points of the set of points from the layout's coordinate axes to the counterclockwise rotated coordinate axes. The equation (1) below provides the mathematical relationship used to perform this mapping.

$$\begin{pmatrix} S_1 \\ T_1 \end{pmatrix} = \begin{vmatrix} \cos\theta & -\sin\theta \\ \sin\theta & \cos\theta \end{vmatrix} \begin{vmatrix} X_1 \\ Y_1 \end{vmatrix} \quad (1)$$

In this equation, (1) $X_i$ and $Y_i$ are the coordinates in the layout's x- and y-axes for the i-th vertex point in the set of point, (2) $S_i$ and $T_i$ are the coordinates in the rotated s- and t-axes for the i-th vertex point in the set of point, and (3) θ is the angle between the rotated coordinate system and the layout's coordinate system.

Figure 8:
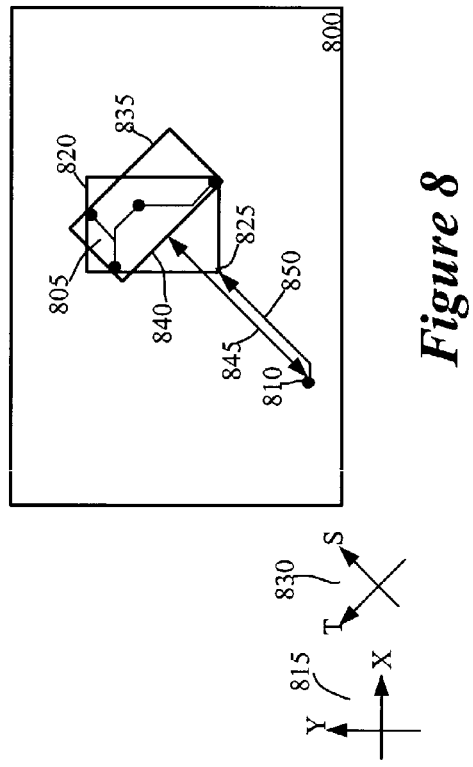
FIG. 8 illustrates an IC layout that includes a set of routed points and an unrouted element.

In the example illustrated in FIG. 8, the angle between the two sets of coordinate axes is 45°, and accordingly the above equation reduces to:

$$S_i = \frac{X_1 - Y_i}{\sqrt{2}}, \text{ and}$$

$$T_i = \frac{X_1 + Y_i}{\sqrt{2}}.$$

These equations can then be used to map the coordinates of each of the four routable elements in the routed point set 805 to coordinates in the rotated coordinate space 830.

At 720, the process 700 then identifies a four-sided bounding box that is defined with respect to the rotated coordinate system 830 and that surrounds the set of routed points. Again, the process can use one of the known techniques in the art for defining such a bounding box. For instance, in some embodiments in FIG. 8, the process (1) identifies the minimum and maximum s- and t-coordinates ($S_{MIN}$, $S_{MAX}$, $T_{MIN}$, and $T_{MAX}$) of each vertex point in the set of routed points, and (2) specifies the four vertices of the rotated box as ($S_{MIN}$, $T_{MIN}$), ($S_{MIN}$, $T_{MAX}$), ($S_{MAX}$, $T_{MIN}$), and ($S_{MAX}$, $T_{MAX}$). FIG. 8 illustrates a 45° rotated bounding box 835 that encloses the set of routed points 805 and that is defined with respect to the rotated coordinate space 830. Next, at 725, the process identifies the octilinear distance between the external point and the rotated bounding box identified at 720. In the example illustrated in FIG. 8, the octilinear distance between the unrouted point 810 and the rotated bounding box 835 is the octilinear distance between the unrouted point 810 and the rotated box's side 840.

The process 700 then defines (at 730) the estimated distance between the unrouted point and the set of routed points. In some embodiments, the process defines this distance to be the maximum of the two distances identified at 710 and 725 (i.e., of the distance to the Manhattan bounding box and the distance to the rotated bounding box). In FIG. 8, the distance 845 between the unrouted point 810 and the rotated box 835 is the maximum distance. Accordingly, this distance 845 is defined as the estimated distance between the unrouted point 810 and the set of routed points 805.

The two-polygon approach of process 700 in general produces better lower-bound estimates of the distance between a point and a set of points than a one-polygon approach. This is because in some circumstances the distance to the Manhattan bounding box is larger, while in other circumstances the distance to the rotated bounding box is larger.

Figure 9:
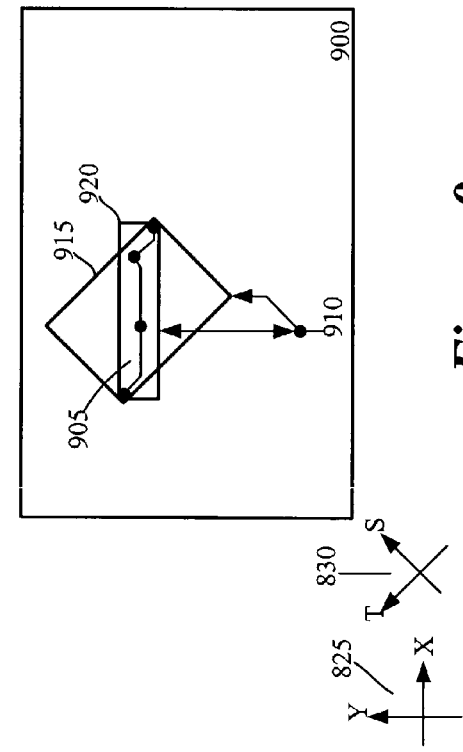
FIG. 9 illustrates an example where the distance between an external point and a Manhattan bounding box that encloses a set of routed points is a larger and more accurate lower-bound estimate than the distance between the external point and a rotated bounding box.

FIGS. 8 and 9 illustrate this advantage. In FIG. 8, the distance to the rotated bounding box provides a more accurate lower bound, as described above. On the other hand, in FIG. 9, the distance between an external point 910 and a Manhattan bounding box 920 that encloses a set of routed points 905 is a larger and more accurate lower-bound estimate than the distance between the external point 910 and a rotated bounding box 915. In each case, the distribution of the set of points and the location of the external point with respect to this distribution affects which bounding polygon provides the better lower-bound estimate.

A good lower-bound estimate of a distance between a point and a set of points is important in many routing applications. For instance, some routers use such lower-bound estimates to discard possible points for expanding a route (e.g., use the estimates in the heuristic function of a best first search algorithm, such as A* and its variants). Accordingly, a good lower-bound estimate allows the router to explore more viable potential route-expansion points.

The two-polygon approach of the process 700 efficiently identifies the minimum distance to an octilinear bounding polygon that encloses a set of points, without having to construct the octilinear bounding polygon. As further described below, the two-polygon approach can also be used to generate quickly an octilinear bounding polygon for a set of points.

II. Bounding Polygons Derived from Point-Set Characteristics

Figure 10:
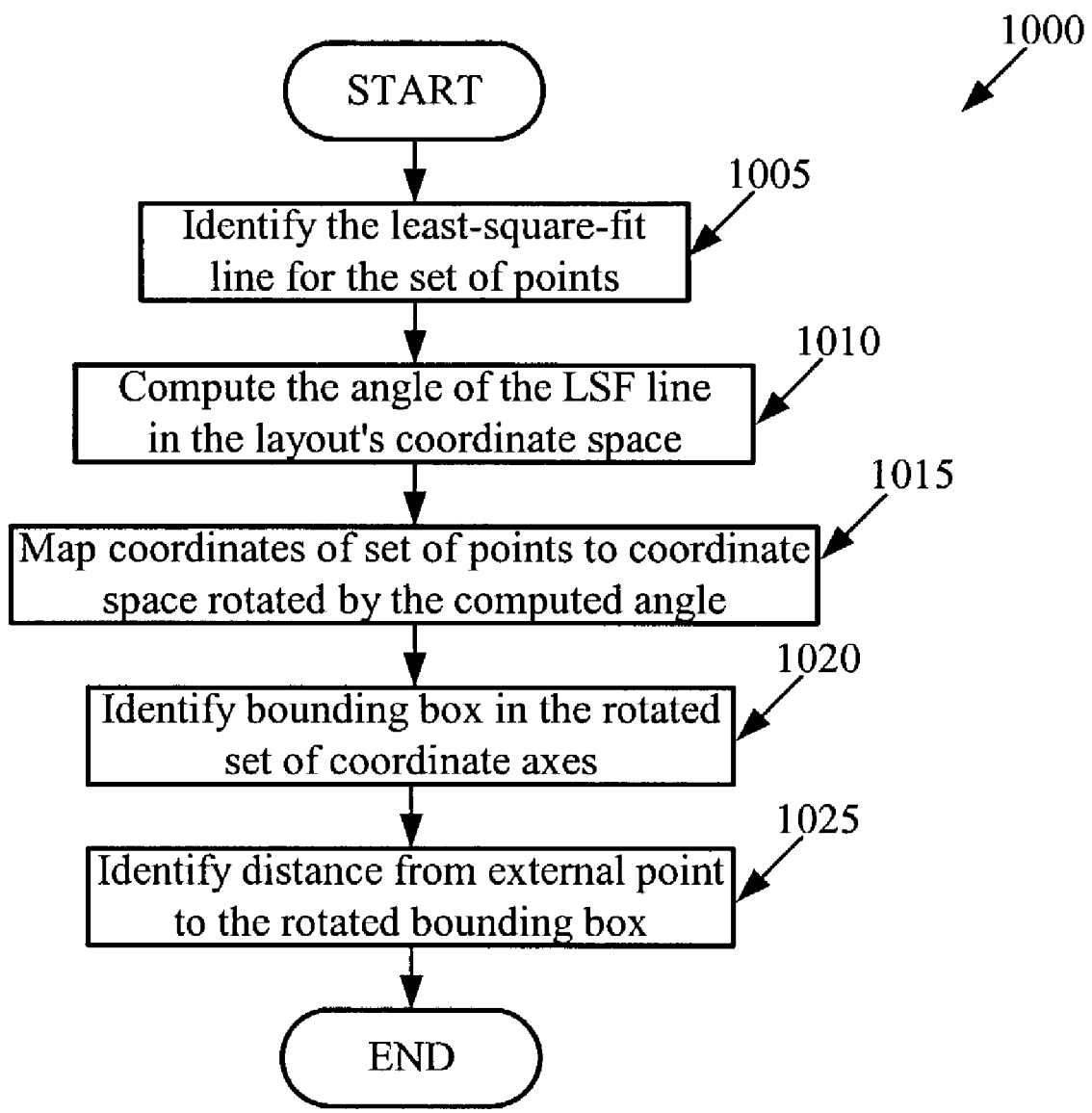
FIG. 10 illustrates a process that computes the estimated distance between a set of points and an external point outside of the set by using a bounding box that is based on a characteristic of the set of points.

Some embodiments provide a method that computes the estimated distance between a set of points and an external point outside of the set by (1) identifying a characteristic of the set of points, (2) based on the identified characteristic, identifying a polygon that encloses the set of points, and (3) identifying the estimated distance as the distance between the external point and the polygon. FIG. 10 illustrates a process 1000 that uses such an approach for a design layout. The characteristic of the set of points that this process identifies is the least-squares-fit line of the set of points. However, one of ordinary skill will realize that other embodiments might focus on other characteristics of the set of points.

Figure 11:
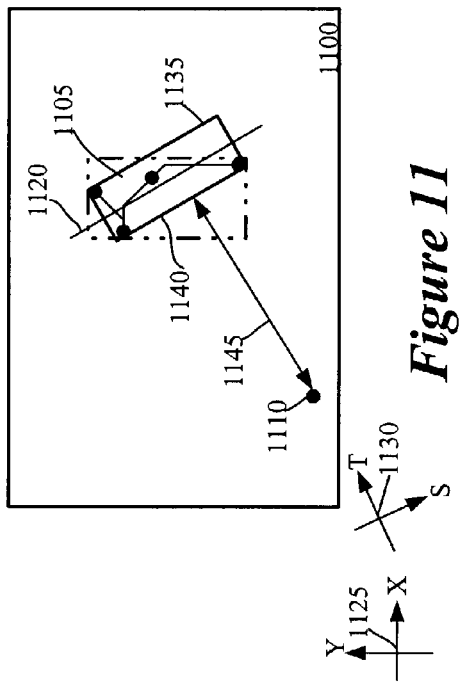
FIG. 11 presents a case where the LSF-bounding box provides a better lower bound estimate than a Manhattan bounding box.

The process 1000 will be described below by reference to the example illustrated in FIG. 11. This figure illustrates an IC layout 1100 that includes a set of routed points 1105 and an unrouted element 1110. In this example, the set 1105 includes four routable elements (e.g., pins) of a net and a set of routing paths between the routable elements. The layout 1100 has a Cartesian coordinate system 1125. This layout uses an octilinear wiring model that allows wiring in horizontal, vertical, and ±45° directions. Even though the process 1000 is described by reference to this example, one of ordinary skill will realize that in other embodiments the set of routing points might include only the routable elements of a net. Also, an EDA router could use process 1000 to identify the distance between a set of unrouted points and a routed point. Alternatively, other EDA or CAD tools could use this process to identify other distances in a layout.

As shown in FIG. 10, the process 1000 initially identifies (at 1005) the least-squares-fit ("LSF") line for the set of points in the design layout. Several publications describe techniques for obtaining the least-squares-fit line for a set of points. One such publication is "Numerical Recipes in C, The Art of Scientific Computing," William H. Press, et al, Second Edition, Cambridge University Press. Such an LSF function typically receives the x- and y-coordinates of a set of points and identifies a line that has a slope m and a y-intercept b so that the following summation, $$\sum_i [Y_1 - (mX_i + b)]^2,$$

is minimized. In this summation, (1) $X_i$ and $Y_i$ are the x- and y-coordinates in the layout's Cartesian coordinate system (e.g., coordinate system 1125 in FIG. 11) for the i-th vertex point in the set of points, and (2) m and b are respectively the slope and y-intercept of the LSF line to be identified. As mentioned above, each standalone point in the set and each point that is a vertex of a convex polygonal shape in the set is a vertex point of the set. In FIG. 11, the LSF line is line 1120.

After 1005 the process 1000 computes (at 1010) the angle θ of the identified LSF line with respect to the layout's x-coordinate axis. This angle is the arctan of the slope of the LSF line. In FIG. 11, the angle of the LSF line is −60°. The process 1000 then identifies a rotated bounding box that encloses the set of routed points. The bounding box is defined with respect to a Cartesian coordinate system that is rotated with respect to the layout's Cartesian coordinate system by the angle θ, which was identified at 1010. In the example illustrated in FIG. 11, the rotated coordinate system 1130 includes an s-axis that is at −60° with respect to the x-axis of the layout's coordinate space 1115, and a t-axis that is at 30° with respect to the x-axis of the layout's coordinate space 1115.

The process performs 1015 and 1020 to identify the rotated bounding box. At 1015, the process maps the coordinates of the vertex points of the set of points from the layout's set of coordinate axes to the rotated set of coordinate axes. The equation (1) above provides the mathematical relationship used to perform this mapping for a point in the set of points. However, in this instance of equation (1), (1) $X_i$ and $Y_i$ are the x- and y-coordinates in the layout's coordinate space for the i-th vertex point in the set of point, (2) $S_i$ and $T_i$ are the s- and t-coordinates in the rotated coordinate system for the i-th vertex point in the set of point, and (3) θ is the identified angle of the LSF line. In the example illustrated in FIG. 11, the angle θ is −60°. Accordingly, the above equation can be used with −60° for θ to map the coordinates of each point in the routed point set 1105 to coordinates in the rotated coordinate space 1160.

At 1020, the process 1000 then identifies a four-sided rotated bounding box that is defined with respect to the rotated coordinate axes and that surrounds the set of routed points. This bounding box has vertices at ($S_{MIN}$, $T_{MIN}$), ($S_{MIN}$, $T_{MAX}$), ($S_{MAX}$, $T_{MIN}$), and ($S_{MAX}$, $T_{MAX}$), where $S_{MIN}$, $S_{MAX}$, $T_{MIN}$, and $T_{MAX}$ are the minimum and maximum s- and t-coordinates of the vertex points of the set of points in the rotated coordinate space. FIG. 11 illustrates a −60° rotated bounding box 1135 that encloses the routed points 1105 and that is defined with respect to the rotated coordinate space 1130.

Next, at 1025, the process identifies the octilinear distance between the external point and the rotated bounding box. Section 11 below describes how some embodiments compute such a distance. In the example illustrated in FIG. 11, the octilinear distance between the unrouted point 1110 and the rotated bounding box 1135 is the octilinear distance 1145 between the unrouted point 1110 and the rotated box's side 1140.

In some embodiments, the process 1000 defines the estimated distance between the unrouted point and the set of routed points as the distance identified at 1025. Other embodiments might define the estimated distance differently. For instance, some embodiments might analyze the distance identified (at 1025) by the process 1000 with the two distances identified at 710 and 725 by the process 700, and select the largest distance among these three distances as the estimated distance between the unrouted point and the set of points.

Figure 12:
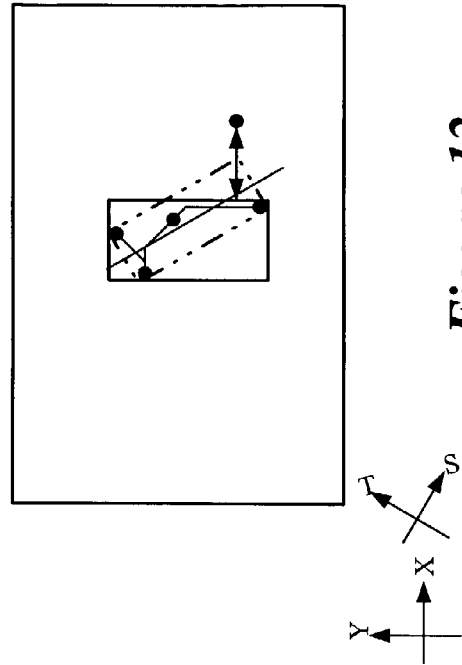
FIG. 12 presents a case where the LSF-bounding box provides a worse lower bound estimate than a Manhattan bounding box.

As mentioned above, it is desirable to have the largest possible lower-bound estimate of a distance between a point and a set of points. In certain circumstances, the LSF-line approach of process 1000 produces good lower-bound estimates of the distance between a point and a set of points. For instance, FIG. 11 presents a case where the LSF-bounding box provides a better lower bound estimate than the Manhattan bounding box. On the other hand, FIG. 12 presents a case where the LSF-bounding box provides a worse lower bound estimate than the Manhattan bounding box. The LSF-line approach works better in the example of FIG. 11 than in the one of FIG. 12 because of the distribution of the set of points and the location of the external point with respect to this distribution.

III. Computing Distances

Some of the above-described embodiments measure the octilinear distance between points and Manhattan bounding boxes, rotated bounding boxes, and other convex bounding polygons (such as actual or approximate convex hulls).

A. Computing Octilinear Distance to Manhattan Bounding Box.

FIG. 13 illustrates how to compute the octilinear distance between an external point and a Manhattan bounding box. This figure illustrated eight regions about a Manhattan bounding box 1305, and three external points 1310, 1315, and 1320. The eight regions are identified by specifying two vectors (a horizontal and a vertical vector) that emanate from each of the four vertices of the bounding box. The eight vectors define four "wedge" and four "channels." Two vectors that emanate from the same vertex define a wedge, while two parallel vectors that emanate from two different vertices define a channel. For instance, in FIG. 13, vectors 1350 and 1355 define a wedge 1360, while vectors 1355 and 1365 define a channel 1370.

After specifying the vectors that identify the wedges and channels, some embodiments identify the wedge or channel that contains the external point. When the external point falls within a channel (i.e., falls within region 1, 2, 3, or 4), these embodiments identify the distance between the external point and the bounding box as length of a line segment that is parallel to the two channel-defining vectors and that starts at the external point and terminates on the bounding box. For instance, external point 1310 in FIG. 13 falls within the channel 1370 defined by parallel vectors 1355 and 1365. Accordingly, the octilinear distance between this point 1310 and the bounding box 1305 is the length of the horizontal line segment 1378 between the point 1310 and the bounding box 1305. On the other hand, the point 1315 in FIG. 13 falls within a channel 1380 defined by parallel vectors 1350 and 1382. Hence, the octilinear distance between this point 1315 and the box 1305 is the length of the vertical line segment 1384 between the point and the bounding box.

When the external point falls within a wedge (i.e., when the external point is in region 5, 6, 7, or 8 in FIG. 13), these embodiments identify the distance between the external point and the bounding box as the octilinear distance between the external point and the bounding box vertex from which the wedge's vectors emanate. This octilinear distance is provided by the following equation (2):

$$\text{Distance} = L + S*(\text{sqrt}(2)-1) \quad (2)$$

In this equation, L and S are respectively the long and short side of the smallest Manhattan bounding box that encloses the external point and the bounding box vertex of the wedge that contains the external point. For example, in FIG. 13, the external point 1320 falls within a wedge 1372 that is defined by vectors 1374 and 1376 that emanate from vertex 1325 of the box 1305. Accordingly, the distance between this external point and the bounding box is provided by equation (2). In this example, the variables L and S in equation (2) correspond respectively to the sides 1335 and 1340 of the Manhattan bounding box 1330, which is the smallest Manhattan bounding box that encloses the point 1320 and the vertex 1325 of the wedge 1372.

The derivation of equation (2) is provided in United States patent application entitled "Method and Apparatus for Considering Diagonal Wiring in Placement," and having the Ser.

No. 09/731,891. The above described embodiment use the octilinear model, which allows horizontal, vertical, and ±45° lines. Other embodiments might use other interconnect models. For instance, some embodiments might use horizontal, vertical, and non-45' diagonal lines. For such embodiments, the distance equation (2) can be generalized to:

Distance=[L−{S(cos A/sin A)}]+S/sin A, where A is the angle of a non-45° diagonal line of the interconnect model in the layout's coordinate axes.

B. Computing Octilinear Distance to Octilinear Bounding Box.

FIG. 14 illustrates how to compute the octilinear distance between an external point and a 45° rotated bounding box 1405. The computation of this distance is analogous to the computation of this distance for the Manhattan bounding box, which was described in the previous sub-section. The only difference is that the vectors that are specified at the vertices of the 45° rotated box are ±45° vectors. Specifically, to compute the distance between an external point and the 45° rotated box, these embodiments (1) define four wedges and four channels by specifying two ±45° vectors at each vertex of the 45° rotated box, (2) identify the wedge or channel that contains the external point, and (3) compute the distance based on the above-described wedge or channel approach.

FIG. 14 illustrates three potential external points 1410, 1415, and 1420. The external point 1410 falls within the channel 1450 that parallel 45° vectors 1452 and 1454 define. Accordingly, the octilinear distance between this point 1410 and the bounding box 1405 is the length of the 45° line segment 1456 between the point 1410 and the bounding box 1405. On the other hand, the point 1415 falls within a channel 1458 defined by parallel 135° vectors 1460 and 1462. Hence, the octilinear distance between this point 1415 and the box 1405 is the length of the 135° line segment 1464 between the point 1415 and the bounding box 1405. Finally, the external point 1420 falls within a wedge 1466 that is defined by vectors 1468 and 1470 that emanate from vertex 1425 of the box 1405. Accordingly, the octilinear distance between this point 1420 and the box 1405 is provided by the equation (2) above. For the point 1420, the variables L and S in equation (2) correspond respectively to the sides 1435 and 1440 of the Manhattan bounding box 1430, which is the smallest Manhattan bounding box that encloses the point 1420 and the vertex 1425 of the wedge 1466.

C. Computing Octilinear Distance to non-45' Rotated Bounding Boxes and to other Convex Bounding Polygons.

FIG. 15 illustrates a process 1500 that computes the octilinear distance between an external point and a non-45' rotated bounding box or a more general bounding polygon, such as a convex hull or an approximate convex hull. This process 1500 first specifies wedge- and channel-defining vectors that emanate from the bounding polygon, and then uses the above-described wedge/channel approach to compute the octilinear distance. This process specifies the emanating vectors based on the following observations. At most eight wedges can be defined about a bounding polygon when the octilinear wiring model is used. The vertices of the bounding polygon are the sources for these eight wedges. As mentioned above, two vectors that emanate from the same vertex define a wedge. Two wedges are abutting wedges when they share a vector, while two wedges are adjacent wedges when they have parallel vectors.

The process 1500 is described by reference to FIG. 16, which illustrate how to identify the vertex of a bounding polygon 1605 for a wedge 1610, and FIG. 17, which illustrates the location of eight wedges 1705–1740 about a bounding polygon 1605. In FIG. 17, the abutting wedge pairs are pair 1715 and 1720, and pair 1735 and 1740. The adjacent wedge pairs are pair 1705 and 1710, pair 1710 and 1715, pair 1720 and 1725, pair 1725 and 1730, pair 1730 and 1735, and pair 1740 and 1705. For each wedge, a bisecting unit vector can be defined that is midway between the two vectors that define the wedge.

As shown in FIG. 15, the process 1500 initially selects (at 1505) one of the eight wedges available for the octilinear wiring model. At 1505, the process also identifies or retrieves the bisecting unit vector for the selected wedge. Next, at 1510, the process identifies the projection of each of the bounding polygon vertices onto the selected wedge's unit vector. Some embodiments project a vertex onto a unit vector by (1) at some arbitrary origin, specifying s- and t-axes, where the s-axis is collinear with the unit vector, (2) identifying a vector that goes from the origin to the vertex, and (3) computing the dot product of the identified vector and the unit vector. FIG. 16 illustrates the projection of the six vertices of the bounding polygon 1605 onto an s-axis 1610 that is collinear with the unit vector 1615 of a selected wedge 1735.

After 1510, the process then specifies a vertex with the maximum projection onto the selected wedge's unit vector as the vertex for the wedge. In FIG. 16, the vertex 1620 has the maximum projection onto the unit vector 1615. Accordingly, this vertex 1620 is the vertex for the wedge 1735. FIG. 17 illustrates wedge 1735 emanating from the vertex 1620.

After 1515, the process determines (at 1520) whether it has identified the vertex location of all the wedges. If not, it returns to 1505 to select an unexamined wedge. Otherwise, the process determines (at 1525) whether there is any bounding polygon vertex that does not serve as the location of a wedge. Any such vertex would be between adjacent wedge pair (i.e., two wedges that have parallel vectors). If the process identifies (at 1525) any bounding polygon vertex that does not serve as a wedge location, the process specifies a vector that emanates from the identified vertex in a direction parallel to the parallel vectors of the adjacent wedge pair that bound the vertex.

Next, at 1530, the process identifies the wedge or channel that contains the external point for which it is computing the distance to the bounding polygon. The process then uses the above-described wedge/channel approach to identify the distance between the external point and the bounding polygon. FIG. 17 presents two external points 1745 and 1750. External point 1745 is within the wedge 1725 (i.e., it is between the two vectors 1755 and 1760 that define the wedge 1725). Accordingly, its distance to the polygon 1605 is the distance (according to equation (2)) between it and the vertex 1765 from which the wedge 1725 emanates. External point 1750, on the other hand, falls within the channel 1770 that is defined by vectors 1760 and 1775 of the adjacent wedge pair 1720 and 1725. This point's distance to the polygon 1605 is the length of the line segment 1780 that is parallel to the channel-defining vectors 1760 and 1775 and that is between the point 1750 and the bounding polygon's side 1785.

IV. Constructing Convex Bounding Polygons

The two-polygon approach can be used to generate quickly an octilinear bounding polygon for a set of points. FIG. 18 illustrates a process 1800 that constructs such an octilinear bounding polygon. The first three operations 705, 715, and 720 of the process 1800 essentially identify two bounding boxes for a set of points. One bounding box is aligned with the layout's x, y coordinate system, while the other is rotated 45° with respect to this coordinate system. The operations 705, 715, and 720 of the process 1800 are similar to the similarly numbered operations of the process 700. Accordingly, the descriptions of these three operations are not are not reiterated here.

Once the process 1800 identifies (at 720) the rotated bounding box for the set of points, it identifies the intersection of the two bounding boxes. There are various known techniques for intersecting two polygons. See, e.g., "Computation Geometry in C," Joseph O'Rourke, 2$^{nd}$ ed. 1998, Section 7.6. FIG. 19 illustrates an example of a bounding polygon 1905 of a set of points 310 that was constructed quickly by intersecting the Manhattan and rotated bounding boxes 605 and 315 of the set of points. This point set and its bounding boxes were described above by reference to FIG. 6.

In the embodiment illustrated in FIG. 18, the process 1800 ends after 1805. However, in other embodiments, the process 1800 after 1805 identifies the distance between an external point and the convex polygon identified at 1805. Some embodiments use the process 1500 of FIG. 15 to compute this distance.

The process 1800 can use a simpler process than the process 1500 of FIG. 15 to compute this distance when the process 1800 identifies its bounding polygon by intersecting a Manhattan bounding box and a 45° rotated bounding box. In such circumstances, the bounding polygon is an octilinear bounding polygon that can only have ±45° and horizontal and vertical sides. FIG. 20 illustrates an example of an octilinear bounding polygon 2025 that is identified by intersecting an axis-aligned box 2030 and a 45° rotated box 2035.

To identify the distance of an external point to such an octilinear bounding polygon, the process 1800 identifies one or more vectors that emanate from each vertex of the polygon. In FIG. 20, four vectors are projected from vertex 2020, three vectors are projected from each of the vertices 2010 and 2015, and two vectors are projected from vertex 2005. These vectors are identified based on the following approach. For each vertex, two directions are identified that are perpendicular to the edges incident upon the vertex and that point away from the polygon, that is, they point 'left' from an incoming clockwise edge, or 'right' from an incoming counter-clockwise edge. Vectors are then specified from each vertex (1) in the two directions identified for the vertex, and (2) in any other octilinear direction that falls between the two identified directions.

After specifying the vectors emanating from the vertices of the octilinear bounding polygon, the process then identifies the distance between the external point and the polygon based on the above described wedge/channel approach. For instance, in FIG. 20, the external point 2045 falls within the wedge 2070 that is defined by vectors 2055 and 2060. Accordingly, its distance to the polygon 2025 is the distance (according to equation (2)) between it and the vertex 2010 from which the wedge 2070 emanates. External point 2050, on the other hand, falls within the channel 2080 that is defined by vectors 2055 and 2065. This points distance to the polygon 2025 is the length of the line segment 2085 that is parallel to the channel-defining vectors 2055 and 2065 and that connects the point 2050 and the bounding polygon's side 2030.

One of ordinary skill will realize that intersecting more than two bounding boxes might reduce the size of the bounding convex polygon for a set of points. Accordingly, some embodiments might intersect more than two bounding polygons. Also, some embodiments might not use a Manhattan bounding box as one of the intersecting polygons.

V. Computer System

Figure 21:
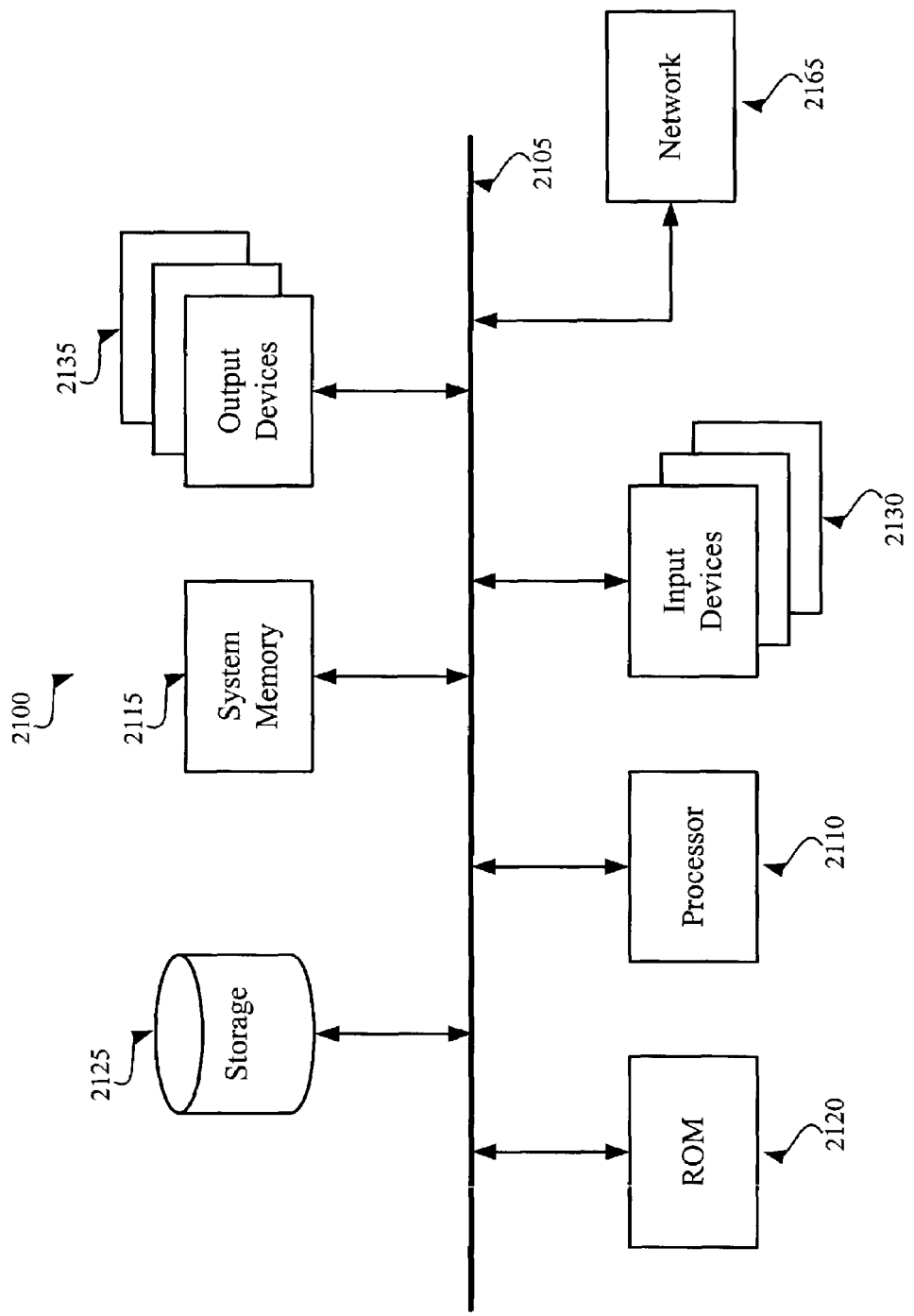
FIG. 21 presents a computer system with which one embodiment of the present invention is implemented.

FIG. 21 presents a computer system with which one embodiment of the present invention is implemented. Computer system 2100 includes a bus 2105, a processor 2110, a system memory 2115, a read-only memory 2120, a permanent storage device 2125, input devices 2130, and output devices 2135.

The bus 2105 collectively represents all system, peripheral, and chipset buses that support communication among internal devices of the computer system 2100. For instance, the bus 2105 communicatively connects the processor 2110 with the read-only memory 2120, the system memory 2115, and the permanent storage device 2125.

From these various memory units, the processor 2110 retrieves instructions to execute and data to process in order to execute the processes of the invention. The read-only-memory (ROM) 2120 stores static data and instructions that are needed by the processor 2110 and other modules of the computer system. The permanent storage device 2125, on the other hand, is a read-and-write memory device. This device is a non-volatile memory unit that stores instruction and data even when the computer system 2100 is off. Some embodiments of the invention use a mass-storage device (such as a magnetic or optical disk and its corresponding disk drive) as the permanent storage device 2125. Other embodiments use a removable storage device (such as a floppy disk or zip® disk, and its corresponding disk drive) as the permanent storage device.

Like the permanent storage device 2125, the system memory 2115 is a read-and-write memory device. However, unlike storage device 2125, the system memory is a volatile read-and-write memory, such as a random access memory. The system memory stores some of the instructions and data that the processor needs at runtime. In some embodiments, the invention's processes are stored in the system memory 2115, the permanent storage device 2125, and/or the read-only memory 2120.

The bus 2105 also connects to the input and output devices 2130 and 2135. The input devices enable the user to communicate information and select commands to the computer system. The input devices 2130 include alphanumeric keyboards and cursor-controllers. The output devices 2135 display images generated by the computer system. For instance, these devices display IC design layouts. The output devices include printers and display devices, such as cathode ray tubes (CRT) or liquid crystal displays (LCD).

Finally, as shown in FIG. 21, bus 2105 also couples computer 2100 to a network 2165 through a network adapter (not shown). In this manner, the computer can be a part of a network of computers (such as a local area network ("LAN"), a wide area network ("WAN"), or an Intranet) or a network of networks (such as the Internet). Any or all of the components of computer system 2100 may be used in conjunction with the invention. However, one of ordinary skill in the art would appreciate that any other system configuration may also be used in conjunction with the present invention.

While the invention has been described with reference to numerous specific details, one of ordinary skill in the art will recognize that the invention can be embodied in other specific forms without departing from the spirit of the invention. For instance, the process 700 identifies Manhattan and rotated bounding polygons. Other embodiments, on the other hand, identify only non-Manhattan polygons. Also, some embodiments identify more than two bounding polygons. For example, some embodiments (1) identify three or more polygons that bound a set of points, (2) for each particular identified polygon, identify a distance from the external point to the particular polygon, and then (3) define the estimated distance as the largest of the identified distances. The intersection of three or more bounding boxes for a set of points provides a good approximate Euclidean convex hull for a set of points. The quality of such an approximate convex hull improves with the number of bounding boxes that are used to create it.

The embodiments described above measure the shortest distance between an external point and a bounding polygon that encloses a set of points. Other embodiments, however, might measure other distances between the external point and the bounding polygon. For instance, some embodiments might measure the distance between the external point and the centroid of the bounding polygon. Other embodiments might measure the distance between the external point and the farthest side of the bounding polygon.

Also, the embodiments described above utilize convex bounding polygons. Other embodiments, however, might use non-convex bounding polygons. To measure the distance between a point and a non-convex bounding polygon, some embodiments might break the non-convex bounding polygon into two or more convex bounding polygons, measure the distance to each such convex bounding polygon, and then specify the distance as the minimum of the two measured distances. Thus, one of ordinary skill in the art would understand that the invention is not to be limited by the foregoing illustrative details, but rather is to be defined by the following claims.

We claim:

1. A method of computing an estimated distance between an external point and a set of points in the region, the method comprising:
   a) identifying a characteristic of the set of points;
   b) based on the identified characteristic, identifying a first polygon that encloses the set of points;
   c) identifying a first distance between the point and the polygon; and
   d) using the identified first distance to identify the estimated distance.

2. The method of claim 1, wherein using the identified first distance comprises identifying the estimated distance as the distance between the point and the polygon.

3. The method of claim 1, wherein identifying the characteristic comprises specifying a least-squares-fit line of the set of points.

4. The method of claim 3,
   wherein the region has a first set of coordinate axes,
   wherein the line is at a particular angle with respect to the first set of coordinate axes,
   wherein identifying the polygon comprises:
   a) identifying the particular angle;
   b) defining the polygon with respect to a second set of coordinate axes that is rotated with respect to the first set of coordinate axes by the particular angle.

5. The method of claim 4, wherein the polygon has a plurality of vertices, wherein defining the polygon with respect to the second set of coordinate axes comprises:
   identifying the coordinates of the polygon's vertices with respect to the second set of coordinate axes based on the coordinates in the second set of coordinate axes of at least some of the points in the set.

6. The method of claim 5, wherein the second set of coordinate axes has at least an s- and t-coordinate axes, wherein the polygon is a four-sided bounding rectangle, and identifying the coordinates of the polygon's vertices comprises:
   a) identifying the minimum and maximum s- and t-coordinates ($S_{MIN}$, $S_{MAX}$, $T_{MIN}$, and $T_{MAX}$) of the set of points in the second coordinate axes, and
   b) specifying four vertices for the bounding rectangle to be ($S_{MIN}$, $T_{MIN}$), ($S_{MIN}$, $T_{MAX}$), ($S_{MAX}$, $T_{MIN}$), and ($S_{MAX}$, $T_{MAX}$).

7. The method of claim 1, wherein the method is used by a router that routes nets within a region of a design layout, and the points include points that the router has routed and potential points for routing.

8. The method of claim 7 further comprising:
   using the estimated distance in routing a net.

9. The method of claim 7 further comprising:
   using the estimated distance to identify potential routes of a net.

10. The method of claim 7 further comprising: using the estimated distance to identify potential points for routing.

11. The method of claim 1 further comprising
    a) identifying a second polygon that encloses the set of point;
    b) identifying a second distance between the external point and a point on or within the second polygon;
    c) wherein using the first distance to identify the estimated distance comprises identifying the estimated distance from one of the first and second distances.

12. The method of claim 11, wherein identifying the estimated distance comprises computing the estimated distance from the first and second distances.

13. The method of claim 11, wherein identifying the estimated distance comprises defining the estimated distance as one of the first and second distances.

14. The method of claim 13, wherein identifying the estimated distance comprises defining the estimated distance as the maximum of the first and second distances.

15. The method of claim 1, wherein the region is a multi-dimensional portion of a computational geometric space.

16. The method of claim 1, wherein the first distance is the distance between the external point and a point on the polygon boundary that is closest to the external point.

17. The method of claim 1, wherein the first polygon is a convex polygon.

18. The method of claim 1, wherein the first polygon is a non-convex polygon.

19. The method of claim 18, wherein identifying the first distance comprises:
    identifying at least two convex polygons the union of which comprises the non-convex polygon
    identifying the distance to each of the identified convex polygons;
    specifying the first distance as the minimum of the identified distances.

20. A computer readable medium comprising a computer program having executable code, the computer program for computing an estimated distance between an external point and a set of points in a region, the computer program comprising sets of instructions for:
    a) identifying a characteristic of the set of points;
    b) based on the identified characteristic, identifying a first polygon that encloses the set of points;
    c) identifying a first distance between the point and the polygon; and d) using the identified first distance to identify the estimated distance.

21. The computer readable medium of claim 20, wherein the set of instructions for using the identified first distance includes a set of instructions for identifying the estimated distance as the distance between the point and the polygon.

22. The computer readable medium of claim 20, wherein the set of instructions for identifying the characteristic includes a set of instructions for specifying a least-squares-fit line of the set of points.

23. The computer readable medium of claim 22,
wherein the region has a first set of coordinate axes,
wherein the line is at a particular angle with respect to the first set of coordinate axes,
wherein the set of instructions for identifying the polygon includes a set of instructions for:
a) identifying the particular angle;
b) defining the polygon with respect to a second set of coordinate axes that is rotated with respect to the first set of coordinate axes by the particular angle.

24. The computer readable medium of claim 23, wherein the polygon has a plurality of vertices, wherein the set of instructions for defining the polygon with respect to the second set of coordinate axes includes set of instructions for:

identifying the coordinates of the polygon's vertices with respect to the second set of coordinate axes based on the coordinates in the second set of coordinate axes of at least some of the points in the set.

25. The computer readable medium of claim 24, wherein the second set of coordinate axes has at least an s- and t-coordinate axes, wherein the polygon is a four-sided bounding rectangle, wherein the set of instructions for identifying the coordinates of the polygon's vertices includes a set of instructions for:
a) identifying the minimum and maximum s- and t-coordinates ($S_{MIN}$, $S_{MAX}$, $T_{MIN}$, and $T_{MAX}$) of the set of points in the second coordinate axes, and
b) specifying four vertices for the bounding rectangle to be ($S_{MIN}$, $T_{MIN}$), ($S_{MIN}$, $T_{MAX}$), ($S_{MAX}$, $T_{MIN}$), and ($S_{MAX}$, $T_{MAX}$).

26. The computer readable medium of claim 20, wherein the computer program is used by a router that routes nets within a region of a design layout, and the points include points that the router has routed and potential points for routing.

* * * * *